(12) United States Patent
Lim

(10) Patent No.: US 8,022,450 B2
(45) Date of Patent: Sep. 20, 2011

(54) IMAGE SENSOR AND METHOD FOR MANUFACTURING THE SAME

(75) Inventor: Gun Hyuk Lim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/563,285

(22) Filed: Sep. 21, 2009

(65) Prior Publication Data

US 2010/0078692 A1 Apr. 1, 2010

(30) Foreign Application Priority Data

Sep. 30, 2008 (KR) .................. 10-2008-0096042

(51) Int. Cl.
*H01L 31/062* (2006.01)
*H01L 31/113* (2006.01)

(52) U.S. Cl. . 257/292; 257/288; 257/214; 257/E21.051; 257/E21.37; 257/E21.248; 257/E21.352; 257/E21.4; 257/E21.421; 257/E21.632

(58) Field of Classification Search .................. 257/214, 257/218, 69, 288, 292, 290, 291, 293, 322, 257/E21.248, 353, 37, 51, 4, 421, 632
See application file for complete search history.

(56) References Cited

U.S. PATENT DOCUMENTS

| | | | | |
|---|---|---|---|---|
| 5,986,297 A * | 11/1999 | Guidash et al. | ............... | 257/223 |
| 6,002,145 A * | 12/1999 | Niisoe | ............... | 257/222 |
| 6,933,168 B2 * | 8/2005 | Bawolek et al. | ............... | 438/70 |
| 7,817,198 B2 * | 10/2010 | Kang et al. | ............... | 348/308 |

FOREIGN PATENT DOCUMENTS

KR 10-2003-0002900 A 1/2003
KR 10-2004-0093988 A 11/2004
* cited by examiner

*Primary Examiner* — David Nhu
(74) *Attorney, Agent, or Firm* — Saliwanchik, Lloyd & Eisenschenk

(57) ABSTRACT

Disclosed are an image sensor and a method for manufacturing the same. The image sensor includes a first pixel having a first photodiode and a first readout circuit and a second pixel having a second photodiode and a second readout circuit. The second pixel is aligned at one side of the first pixel, and a light receiving area of the first photodiode is different from a light receiving area of the second photodiode.

13 Claims, 3 Drawing Sheets

IMAGE SENSOR AND METHOD FOR MANUFACTURING THE SAME

CROSS-REFERENCE TO RELATED APPLICATION

This application claims the benefit under 35 U.S.C. §119 of Korean Patent Application No. 10-2008-0096042, filed Sep. 30, 2008, which is hereby incorporated by reference in its entirety.

BACKGROUND

A CIS (CMOS image sensor) according to the related art includes a photodiode area that receives a light signal to convert the light signal into an electric signal, and a transistor area that processes the electric signal.

The CIS according to the related art reproduces colors by obtaining green, blue, and red (G/B/R) color signals from four pixels having the same size.

However, outputs of the G/R/B color signals may vary depending on a junction profile of a photodiode, a wavelength of light, and a structure of the CIS. If a color pixel has a low-level output, more gain is needed to increase the output of the color signal, so that variable amplification must be performed for each color pixel. In this case, noise components are also amplified, so that image quality of the CIS may be degraded.

BRIEF SUMMARY

An image sensor according to an embodiment includes a first pixel having a first photodiode and a first readout circuit; and a second pixel having a second photodiode and a second readout circuit. The second pixel is aligned at one side of the first pixel and a light receiving area of the first photodiode is different from a light receiving area of the second photodiode.

DETAILED DESCRIPTION

Hereinafter, embodiments of an image sensor and a method for manufacturing the same will be described in detail with reference to accompanying drawings.

In the description of an embodiment, it will be understood that, when a layer is referred to as being "on" or "under" another layer, it can be "directly" or "indirectly" on the other layer, or one or more intervening layers may also be present.

First Embodiment

Figure 1:
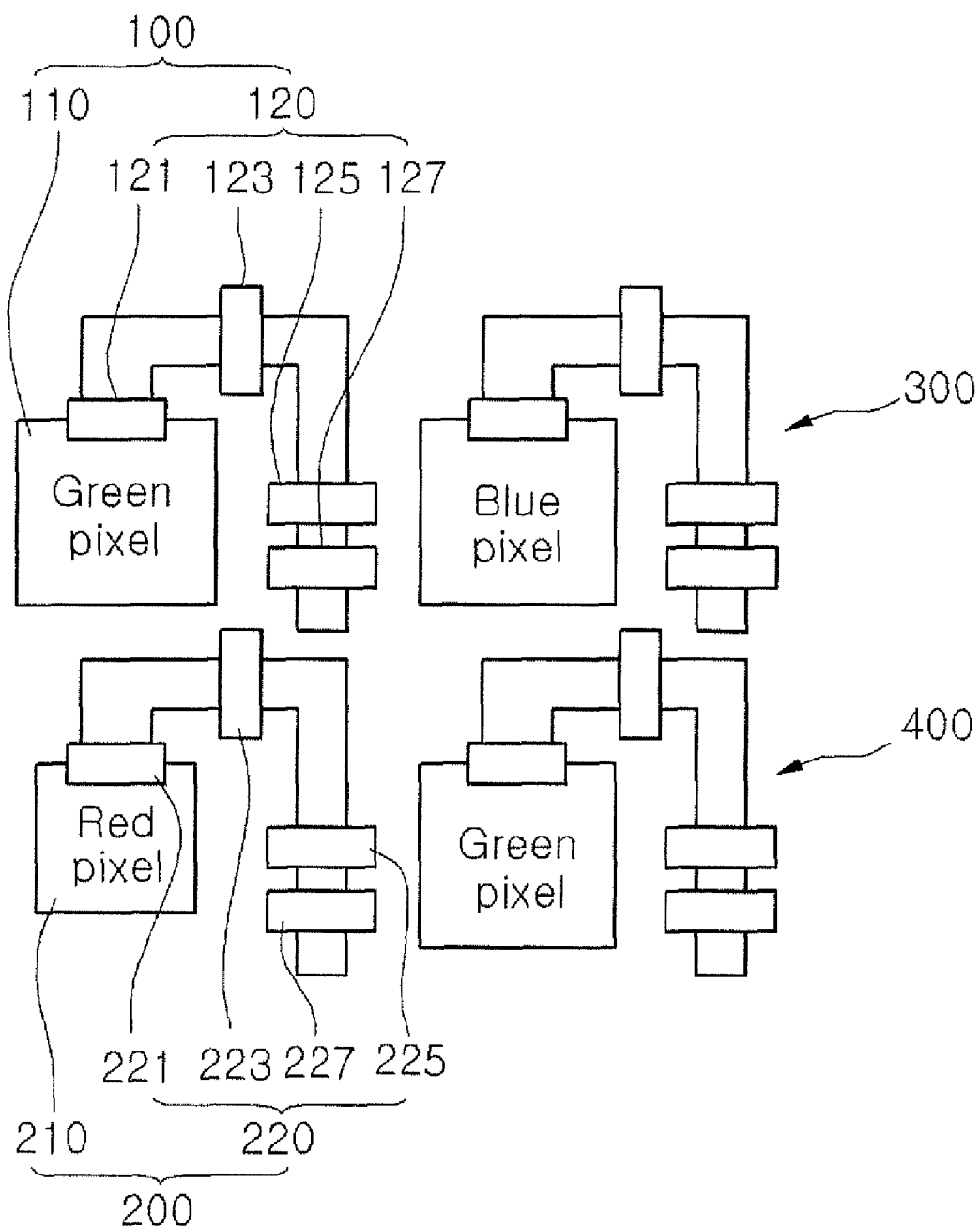
FIG. 1 is a plan view showing an image sensor according to a first embodiment.

FIG. 1 is a plan view showing an image sensor according to a first embodiment.

The image sensor according to the first embodiment includes a first pixel 100 having a first photodiode 110 and a first readout circuit 120, and a second pixel 200 having a second photodiode 210 and a second readout circuit 220. The second pixel 200 is aligned at one side of the first pixel. According to the first embodiment, a light receiving area of the first photodiode 110 may be different from a light receiving area of the second photodiode 210.

According to the image sensor of the first embodiment, the light receiving area of the photodiode of a pixel varies depending on an output level of the color the pixel is used for. That is, the light receiving area for a color having a low-level output is enlarged and the light receiving area for the color having a high-level output is reduced, such that the output level of the R/G/B color signals can be constantly maintained.

In addition, according to an embodiment, since each color has the same output level, variable amplification for each color may not be required. As a result, noise variation may not occur among the colors, so that the image quality of the image sensor can be improved.

Hereinafter, a method for manufacturing the image sensor according to the first embodiment will be described with reference to FIG. 1.

A first pixel 100 including a first photodiode 110 and a first readout circuit 120 is formed in an active area (not shown) of a substrate. For instance, the first photodiode 110 may be formed through an ion implantation process and the first photodiode 110 may correspond to the green color, but embodiments are not limited thereto.

In addition, a channel ion implantation process can be performed and polysilicon can be formed on the substrate. Then, photo and etching processes are performed to form the first readout circuit 120. The first readout circuit 120 may include a first transfer transistor gate 121, a first reset transistor gate 123, a first drive transistor gate 125 and a first select transistor gate 127, but embodiments are not limited to a four transistor type readout circuit.

A second pixel 200, a third pixel 300 and a fourth pixel 400 can be aligned at sides of the first pixel 100 when forming the first pixel 100. The second pixel 200 may correspond to the red color, the third pixel 300 may correspond to the blue color, and the fourth pixel 400 may correspond to green pixel, but embodiments are not limited thereto.

Similar to the first pixel 100, the second pixel 200 may include a second transfer transistor gate 221, a second reset transistor gate 223, a second drive transistor gate 225 and a second select transistor gate 227. Of course, embodiments are not limited thereto. Readout circuits of the third and fourth pixels 300 and 400 may also have the structure similar to the structure of the first readout circuit 120 of the first pixel 100.

According to the first embodiment, the light receiving area of the photodiode of the pixel varies depending on the output level of the corresponding color signal. That is, the light receiving area for a color having a low-level output is enlarged and the light receiving area for a color having a high-level output is reduced, so that the output level of the R/G/B colors can be constantly maintained.

For instance, the layout of the second pixel 200, which is shown as the red pixel, or the layout of the third pixel 300, which is shown as a blue pixel, can be enlarged or reduced according to the type of products. In addition, if it is necessary to adjust the color of the screen into the reddish color or the bluish color, the layout of the pixels can be changed.

For example, referring to FIG. 1, when it is needed to reduce the red value because the red color signal has the high-level output, the size of the light receiving part of the second photodiode 210 (the red pixel) is reduced.

Second Embodiment

Figure 2:
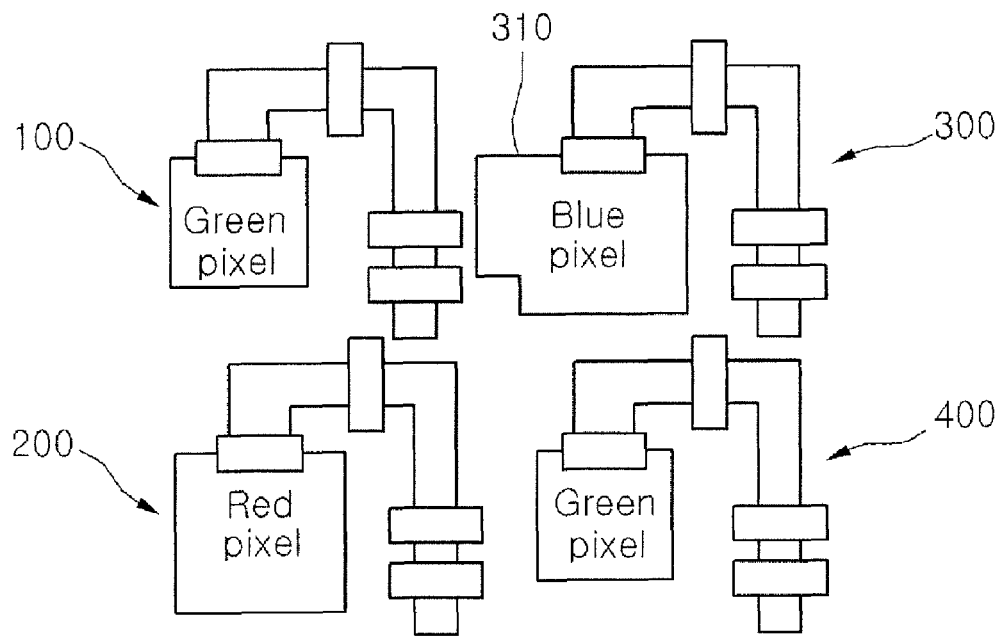
FIG. 2 is a plan view showing an image sensor according to a second embodiment.

FIG. 2 is a plan view showing an image sensor according to a second embodiment.

Different from the first embodiment, the second embodiment is employed when the blue color has the low-level output or the color of the image must be changed into the bluish color. In this case, the size of the light receiving parts of the first and fourth pixels 100 and 400, which are the green pixels, is reduced; and the size of the third photodiode 310 of the third pixel 300, which is the blue pixel, is enlarged. In general, since two green pixels are used to output the data from a region for every one blue or red pixel, the green pixels are relatively free against the external influence.

According to the image sensor and the method for manufacturing the same of the second embodiment, the light receiving area of the photodiode of the pixel may vary depending on the output level of the colors. That is, the light receiving area for the color having a low-level output is enlarged and the light receiving area for the color having a high-level output is reduced, so that the output level of the R/G/B colors can be constantly maintained.

Third Embodiment

Figure 3:
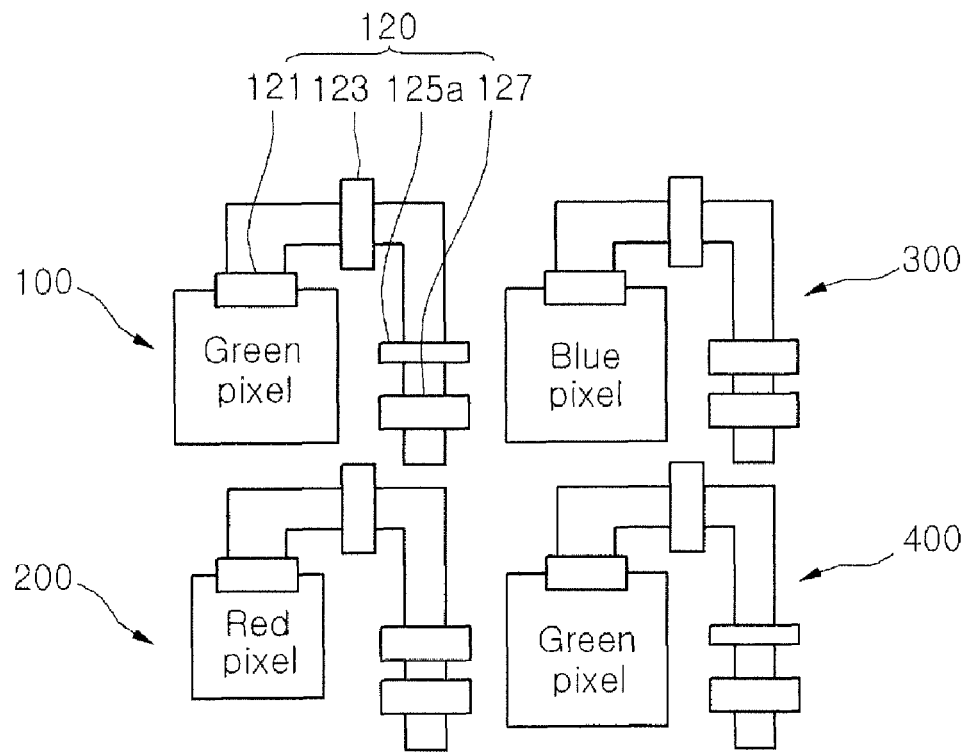
FIG. 3 is a plan view showing an image sensor according to a third embodiment.

FIG. 3 is a plan view showing an image sensor according to a third embodiment.

According to the third embodiment, in addition to the features of the first embodiment, the threshold voltage of the first drive transistor 125 of the first readout circuit 120 may be different from threshold voltage of the second drive transistor 225 of the second readout circuit 220.

For example, the width of the first drive transistor 125a is different than the width of the second drive transistor 225. For instance, the critical dimension used for the first drive transistor 125a of the first readout circuit 120 may be different from the critical dimension used for the second drive transistor 225 of the second readout circuit 220. For example, a different multiplier (of the smallest critical dimension for a gate in a fabrication process) may be used for the widths of the first drive transistor 125a and the second drive transistor 225.

In detail, the output of the pixel is inversely proportional to the threshold voltage of the drive transistor, and the gain of the drive transistor is inversely proportional to the threshold voltage of the drive transistor.

Therefore, if the threshold voltage of the drive transistor is high, the gain is reduced so that the output is also reduced. The output level of the R/G/B colors can be adjusted by utilizing the above principle, such that color sensitivity can be increased or decreased.

According to the image sensor of the third embodiment, the channel length is selectively shortened or lengthened (using the width of the drive transistor) in order to adjust the threshold voltage of the drive transistor, which amplifies the output of the pixel, so that the gain can be controlled suitably for each color, thereby constantly maintaining the color output of each pixel. In addition, according to an embodiment, since each color has the same output level, variable amplification for each color signal may not be required. As a result, noise variation may not occur among the colors, so that the image quality of the image sensor can be improved.

In detail, according to the third embodiment, as shown in FIG. 3, the width of the first drive transistor 125a of the first pixel 100, which corresponds to the green pixel, is relatively reduced as compared to the other color pixel transistors to increase the sensitivity of the green color signal, thereby reducing the threshold voltage.

Fourth Embodiment

Figure 4:
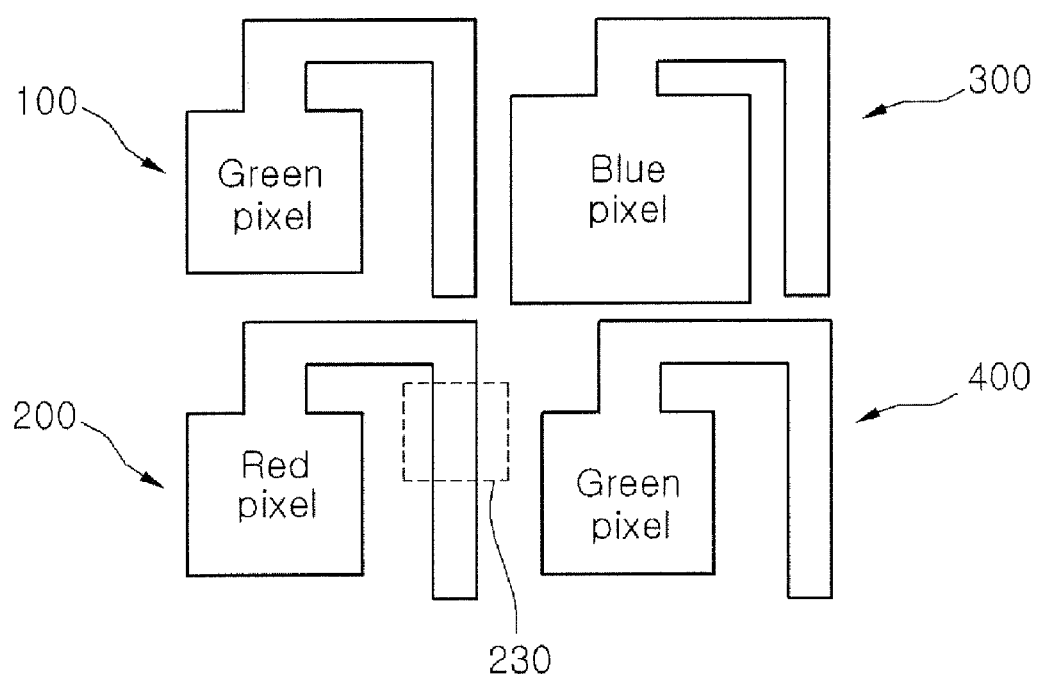
FIG. 4 is a plan view showing an image sensor according to a fourth embodiment.

FIG. 4 is a plan view showing an image sensor according to a fourth embodiment.

According to the fourth embodiment, an additional channel implantation is performed in order to adjust the threshold voltage of the drive transistor, which amplifies the output of the pixel, so that the gain can be controlled suitably for each color, thereby constantly maintaining the color output of each pixel. Thus, according to the fourth embodiment, each color signal has the same output level, so variable amplification for each color signal may not be required. As a result, noise variation may not occur among the colors, so that the image quality of the image sensor can be improved.

The fourth embodiment has various features in addition to or in place of the features of the first embodiment. In detail, as shown in FIG. 4, an additional ion implantation area 230 is formed in the region of the second drive transistor 225 of the second pixel 200, which corresponds to the red pixel, to reduce the sensitivity of the red color, thereby increasing the threshold voltage of the second drive transistor 225. Such an additional ion implantation area 230 can be formed through the channel implantation process before the gate has been formed. For instance, the additional ion implantation area 230 can be formed on the region where the second transistor 225 of the second pixel 200 will be formed. In the case of the NMOS, a P-type ion implantation area 230 is formed. The additional ion implantation area 230 can be formed through an additional ion implantation separate from a channel ion implantation for the drive transistors of the pixels.

According to another embodiment, the additional ion implantation area may include ions having the type opposite to the type of ions implanted into the channel ion implantation area 230. In such a case, the channel width is narrowed, so that the threshold voltage can be lowered. For instance, the center of the channel ion implantation area for the second drive transistor 225 can be covered with an ion implantation mask (not shown), and ions having the type opposite to the type of ions implanted into the channel ion implantation area are additionally implanted into the both sides of the channel ion implantation area, thereby reducing the width of the channel area.

Various embodiments can be provided within the scope of the claims without being limited to the above-described embodiments and drawings.

According to the image sensor and the method for manufacturing the same of certain embodiments of the present invention, the light receiving area of the photodiode of the pixel may vary depending on the output level of the colors. That is, the light receiving area for the color having a low-level output is enlarged and the light receiving area for the color having a high-level output is reduced, so that the output level of the R/G/B colors can be constantly maintained.

In addition, according to an embodiment, the channel length of the drive transistor can be selectively shortened or lengthened in order to adjust the threshold voltage of the drive transistor, which amplifies the output of the pixel, so that the gain can be controlled suitably for each color, thereby constantly maintaining the color output of each pixel.

In addition, according to a further embodiment, an additional channel implantation can be performed in order to adjust the threshold voltage of the drive transistor, which amplifies the output of the pixel, so that the gain can be controlled suitably for each color, thereby constantly maintaining the color output of each pixel.

Further, according to an embodiment, since each color has the same output level, variable amplification for each color signal may not be required. As a result, noise variation may not occur among the colors, so that the image quality of the image sensor can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a first pixel including a first photodiode formed in a substrate and a first readout circuit formed over the substrate; and
   a second pixel including a second photodiode formed in the substrate and a second readout circuit formed over the substrate, the second pixel being aligned at one side of the first pixel,
   wherein a size of a light receiving area of the first photodiode is different from a size of a light receiving area of the second photodiode.

2. The image sensor of claim 1, wherein a threshold voltage of a first drive transistor of the first readout circuit is different from a threshold voltage of a second drive transistor of the second readout circuit.

3. The image sensor of claim 2, wherein a width of the first drive transistor of the first readout circuit is different from a width of the second drive transistor of the second readout circuit.

4. The image sensor of claim 2, wherein a channel ion implantation for the first drive transistor of the first readout circuit is different from a channel ion implantation for the second chive transistor of the second readout circuit.

5. The image sensor of claim 1, wherein a channel length of a first drive transistor of the first readout circuit is different from a channel length of a second drive transistor of the second readout circuit.

6. A method for forming an image sensor according to claim 1, the method comprising:
   forming a first pixel including a first photodiode and a first readout circuit; and
   forming a second pixel including a second photodiode and a second readout circuit at one side of the first pixel,
   wherein the size of a light receiving area of the first photodiode is different from the size of a light receiving area of the second photodiode.

7. The method of claim 6, wherein forming the first pixel and forming the second pixel comprises:
   making a threshold voltage of a first drive transistor of the first readout circuit different from a threshold voltage of a second drive transistor of the second readout circuit.

8. The method of claim 6, wherein forming the first pixel and forming the second pixel comprises:
   making a channel length of a first drive transistor of the first readout circuit different from a channel length of a second drive transistor of the second readout circuit.

9. The method of claim 8, wherein making the channel length of the first drive transistor of the first readout circuit different from the channel length of the second drive transistor of the second readout circuit comprises:
   forming a width of the first drive transistor of the first readout circuit different from a width of the second drive transistor of the second readout circuit.

10. The method of claim 8, wherein making the channel length of the first drive transistor of the first readout circuit different from the channel length of the second drive transistor of the second readout circuit comprises:
    performing a channel ion implantation for the second drive transistor of the second readout circuit differently than a channel ion implantation for the first drive transistor of the first readout circuit.

11. The method of claim 10, wherein performing the channel ion implantation for the second drive transistor of the second readout circuit differently than the channel ion implantation for the first drive transistor of the first readout circuit comprises:
    performing an initial channel ion implantation for the second drive transistor of the second readout circuit; and
    performing an additional channel ion implantation for the second drive transistor of the second readout circuit.

12. The method of claim 11, wherein the additional channel ion implantation for the second drive transistor of the second readout circuit employs ions having a type identical to a type of ions used in performing the initial channel ion implantation for the second drive transistor of the second readout circuit.

13. The method of claim 11, wherein the additional channel ion implantation for the second drive transistor of the second readout circuit employs ions having a type opposite to a type of ions used in performing the initial channel ion implantation for the second drive transistor of the second readout circuit.

* * * * *

UNITED STATES PATENT AND TRADEMARK OFFICE
CERTIFICATE OF CORRECTION

PATENT NO.         : 8,022,450 B2                                          Page 1 of 1
APPLICATION NO.    : 12/563285
DATED              : September 20, 2011
INVENTOR(S)        : Gun Hyuk Lim It is certified that error appears in the above-identified patent and that said Letters Patent is hereby corrected as shown below:

Title Page,
Item (73) Assignee, "LG Innotek Co., Ltd." should read --Dongbu Hitek Co., Ltd.--.

Signed and Sealed this
Thirteenth Day of March, 2012

David J. Kappos
*Director of the United States Patent and Trademark Office*